United States Patent
Nuebling et al.

(10) Patent No.: US 11,841,394 B2
(45) Date of Patent: Dec. 12, 2023

(54) CIRCUIT CONTAINING A TRANSFORMER AND CORRESPONDING METHOD

(71) Applicant: Infineon Technologies AG, Neubiberg (DE)

(72) Inventors: Marcus Nuebling, Olching-Esting (DE); Jaafar Mejri, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 178 days.

(21) Appl. No.: 17/068,711

(22) Filed: Oct. 12, 2020

(65) Prior Publication Data
US 2021/0123970 A1    Apr. 29, 2021

(30) Foreign Application Priority Data
Oct. 25, 2019 (DE) .......................... 10201912893.0

(51) Int. Cl.
*H01L 23/522* (2006.01)
*H01L 23/58* (2006.01)
(Continued)

(52) U.S. Cl.
CPC ..... *G01R 31/2879* (2013.01); *G01R 31/2856* (2013.01); *G01R 31/52* (2020.01);
(Continued)

(58) Field of Classification Search
CPC ........... G01R 31/2879; G01R 31/2856; G01R 31/52; G01R 31/62; H01F 27/2804; H01F 27/402; H01F 27/28; H01F 27/32; H01L 23/5223; H01L 23/5228; H01L 23/585; H03K 17/56
See application file for complete search history.

(56) References Cited

U.S. PATENT DOCUMENTS

| 5,967,848 A * | 10/1999 | Johnson ............... H05K 7/1092 |
| | | 439/620.21 |
| 6,094,144 A | 7/2000 | Dishongh et al. |

(Continued)

FOREIGN PATENT DOCUMENTS

| DE | 102008054502 A1 | 7/2009 |
| DE | 102012109164 A1 | 3/2013 |

(Continued)

OTHER PUBLICATIONS

Office Action, in the German language, from counterpart German Application No. 102019128930.0, dated Jul. 17, 2020, 9 pp.

*Primary Examiner* — Farhana A Hoque
*Assistant Examiner* — Joseph O Nyamogo
(74) *Attorney, Agent, or Firm* — Shumaker & Sieffert, P.A.

(57) ABSTRACT

A circuit is provided, comprising a transformer having a first coil that is arranged on a substrate and a second coil that is arranged on the substrate above the first coil, and a dielectric between the first coil and the second coil. The circuit furthermore comprises a guard ring around the transformer. The circuit furthermore comprises a diagnostic circuit (55) that is configured so as to ground the guard ring in a normal operating mode and to measure a measurement voltage or a measurement current at a measurement impedance between the guard ring and the ground potential in a diagnostic operating mode.

17 Claims, 3 Drawing Sheets

(51) Int. Cl.
  *H01F 27/40* (2006.01)
  *G01R 31/28* (2006.01)
  *H01F 27/28* (2006.01)
  *G01R 31/52* (2020.01)
  *G01R 31/62* (2020.01)
  *H01F 27/32* (2006.01)
  *H03K 17/56* (2006.01)

(52) U.S. Cl.
  CPC ............ *G01R 31/62* (2020.01); *H01F 27/28* (2013.01); *H01F 27/2804* (2013.01); *H01F 27/32* (2013.01); *H01F 27/402* (2013.01); *H01L 23/5223* (2013.01); *H01L 23/5228* (2013.01); *H01L 23/585* (2013.01); *H03K 17/56* (2013.01)

(56) References Cited

U.S. PATENT DOCUMENTS

| | | |
|---|---|---|
| 9,698,107 B2 | 7/2017 | Bonart et al. |
| 2009/0154035 A1 | 6/2009 | Galvano et al. |
| 2013/0075861 A1 | 3/2013 | Kerber et al. |
| 2013/0308234 A1* | 11/2013 | Hyvonen ................ H02H 3/20 |
| | | 361/56 |

FOREIGN PATENT DOCUMENTS

| | | | |
|---|---|---|---|
| DE | 102014117723 A1 | 6/2016 | |
| EP | 2255424 A1 * | 12/2010 | ............. H02H 1/063 |

* cited by examiner

CIRCUIT CONTAINING A TRANSFORMER AND CORRESPONDING METHOD

This Application claims priority to German Application Number 102019128930.0, filed on Oct. 25, 2019, the entire content of which is incorporated herein by reference.

TECHNICAL FIELD

The present application relates to circuits containing a transformer and to corresponding methods, in particular to circuits and methods by way of which a diagnosis, for example with regard to leakage currents, is made possible.

BACKGROUND

In various applications, for example automotive applications, it is necessary to transmit signals between different voltage domains, for example a circuit part that operates at high voltage (for example in the range >20 V or >100 V, for example 400 V) and a circuit part that operates at low voltages (for example 5 V or 12 V). The abovementioned voltage values should in this case be understood merely as examples.

Transformers in this case represent one option for transmitting signals between the voltage domains. One specific type of such transformers are what are known as careless transformers in which coils of the transformer are arranged in different metal layers on a substrate, in particular a semiconductor substrate, with a dielectric situated between them. The coils are in this case usually surrounded by a grounded guard ring.

Such a transformer may be provided with signal transmission with simultaneous provision of an insulation barrier that prevents the flow of currents, in particular DC currents, between the voltage domains. In this context, it is important or even safety-critical in many applications for this insulation, barrier to be intact and for example for no leakage currents to flow across the insulation barrier.

SUMMARY

A circuit as claimed in claim 1 and a method as claimed in claim 8 are provided. The dependent claims define further embodiments.

According to one exemplary embodiment, provision is made in this case for a circuit that comprises a transformer and a guard ring around the transformer. The transformer has a first coil that is arranged on a substrate and a second coil that is arranged on the substrate above the first coil, and a dielectric between the first coil and the second coil. The circuit furthermore has a diagnostic circuit that is configured so as to ground, the guard ring in a normal operating mode and to tap off a measurement voltage or a measurement current at a measurement impedance between the guard ring and the ground potential in a diagnostic operating mode in order thereby to be able to detect a leakage current.

Also provided is a corresponding method for such a transformer for detecting a leakage current, wherein the method comprises grounding the guard ring in a normal operating mode and tapping off a measurement voltage or a measurement current at a measurement impedance between the guard ring and the ground potential in a diagnostic operating mode in order to detect the leakage current.

The above summary gives just a brief overview of a few exemplary embodiments and should not be interpreted as restrictive, since other exemplary embodiments may contain features other than those discussed above.

DETAILED DESCRIPTION

Various exemplary embodiments are explained in detail below. These serve only as examples and should not be interpreted as restrictive. By way of example, in other exemplary embodiments, some of the illustrated features, components or method steps may be omitted or replaced with alternative features, components or method steps. In addition to the explicitly illustrated features, components and method steps, further features, components or method steps may also be provided, in particular features and components that are used in conventional transformer circuits and that are therefore not described explicitly here.

Figure 1:
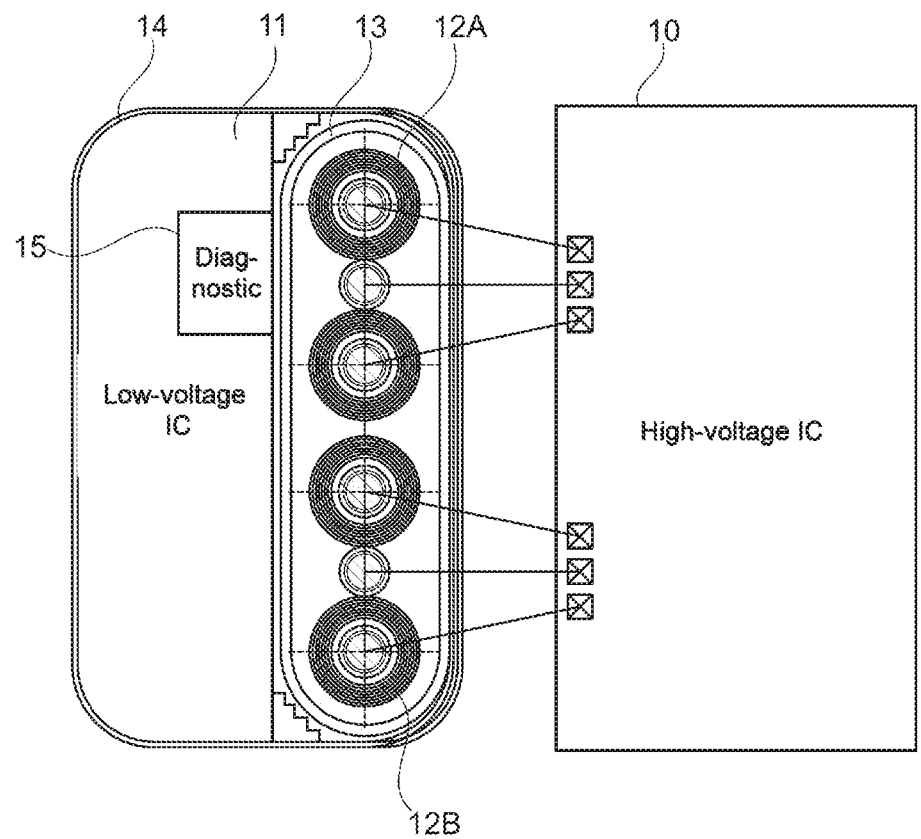
FIG. 1 is a plan view of a circuit according to one exemplary embodiment.

Exemplary embodiments described below relate to leakage current diagnosis in what are known as careless transformers. FIG. 1 is a diagram of a circuit according to one exemplary embodiment.

The circuit of FIG. 1 comprises a high-voltage integrated circuit 10 (high-voltage IC) and a low-voltage integrated circuit 11 (low-voltage IC). The terms "high-voltage" and "low-voltage" should in this case initially be understood in relation to one another, that is to say the high-voltage integrated circuit 10 operates at higher voltages than the low-voltage integrated circuit 11. By way of example, the high-voltage integrated circuit 10 may operate at voltages >20 V or >100 V, for example 400 V.

The low-voltage integrated circuit 11 may for example comprise sensor circuits, calculation circuits and/or logic circuits. It should be noted that any other kind of circuits may also be used in the low-voltage integrated circuit 11 and in the high-voltage integrated circuit 10.

In some exemplary embodiments, the high-voltage integrated circuit 10 may comprise power transistors for switching high currents or voltages, for example for driving a three-phase electric motor, and the low-voltage integrated circuit 11 may comprise a control circuit for controlling the power transistors.

In order to make it possible to transmit signals, for example control signals for the abovementioned power transistors, between the high-voltage integrated circuit 10 and the low voltage integrated circuit 11, a transformer arrangement comprising a first transformer 12A and a second transformer 12B is provided. Signals are able to be transmitted inductively between the high-voltage integrated circuit 10 and the low-voltage integrated circuit 11 via the transformers 12A, 12B.

In the exemplary embodiment of FIG. 1, each transformer 12A, 12B has a differential configuration with two coil pairs. This may improve a quality of the signal transmission. Such differential or even single-pole configurations of transformers may be adopted in any conventional way. The transformers 12A, 12B are connected to the high-voltage integrated circuit 10 by bonding wires.

Figure 2:
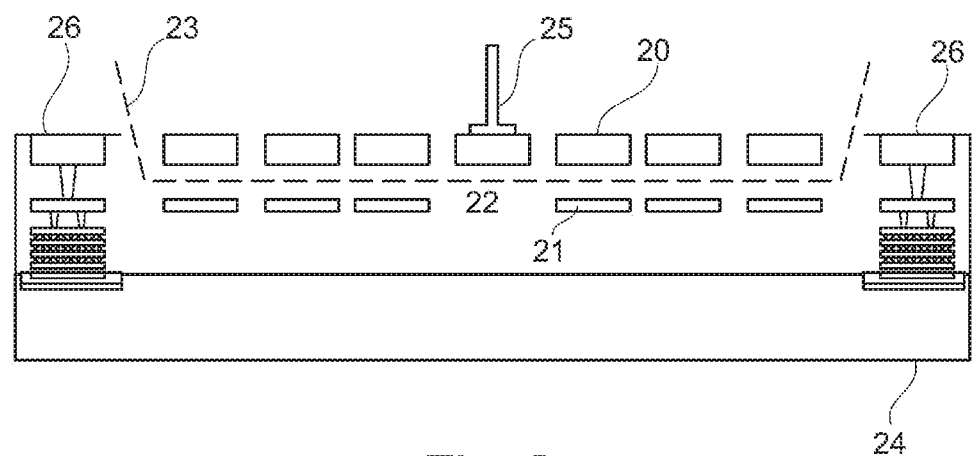
FIG. 2 is a schematic cross-sectional view of part of the circuit of FIG. 1.

For the sake of illustration, FIG. 2 shows a simplified cross-sectional view of such a transformer. In FIG. 2, in this case, a first coil 21 is arranged in a first metal layer above a substrate 24 and a second coil 20 is arranged in a second metal layer above the substrate 24. A dielectric 22 is arranged between the coils 20, 21. The substrate 24 may be a semiconductor substrate on which, in the case of FIG. 1, the rest of the low-voltage integrated circuit 11 is also formed. The first coil 20 is then connected to the high-voltage integrated circuit 10 by a bonding wire 25, while the second coil 21 is connected to the rest of the low-voltage integrated circuit 11 by metal connections (not illustrated), for example in the second metal layer of the second coil 21 or in further metal layers. Other coil pairs in the case of a differential configuration of the transformer and further coil pairs of further transformers (for example of the transformers 12A, 12B of FIG. 1) may be designed accordingly.

Figure 3:
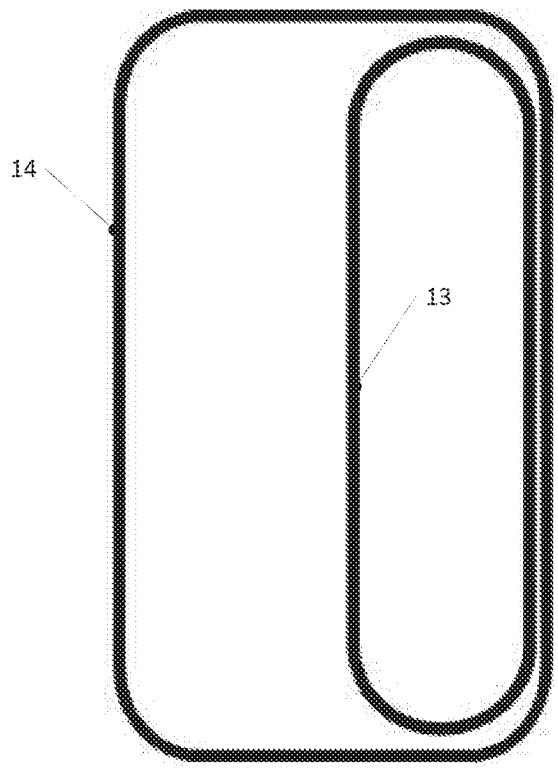
FIG. 3 shows guard rings of the circuit from FIG. 1.

A guard ring 13 is arranged around the transformers 12A, 12B of FIG. 1. This guard ring is formed by a ring structure separate from a guard ring 14 that surrounds the entire low-voltage integrated circuit 11. This implementation of the guard rings 13 and 14 as separate ring structures is shown clearly again in FIG. 3. It should be noted that both guard rings 13 and 14 may be at the same ground potential, in particular in a normal operating mode that is described in more detail below.

The guard ring 13 may for example be formed by vertical connections (vias; vertical interconnect access) of metal sections in a plurality of metal layers, as shown in FIG. 2 for a guard ring 26. These metal layers comprise, in particular in the case of FIG. 2, the metal layers in which the first coil 20 and the second coil 21 are also formed.

The guard ring 13 of FIG. 1 or the guard ring 26 of FIG. 2 forms lateral insulation for the transformers. Such an arrangement having transformers and a guard ring leads to an insulation barrier between a high-voltage domain of the high-voltage integrated circuit 10 and a low-voltage domain of the low-voltage integrated circuit 11. This insulation barrier is illustrated in FIG. 2 in dashed form as insulation barrier 23.

In a fault-free state, no leakage currents flow across this insulation barrier, for example no DC current flows from the high-voltage domain of the high-voltage integrated circuit 10 to the low-voltage domain of the low-voltage integrated circuit 11.

In order to be able to detect such leakage currents, which may occur in the case of an incorrectly operating insulation barrier, the low-voltage integrated circuit 11 of FIG. 1 has a diagnostic circuit 15. In a normal operating mode of the circuit, in which signals are transmitted between the high-voltage integrated circuit 10 and the low-voltage integrated circuit 11 by way of the transformers 12A and 12B, the diagnostic circuit 15 grounds the guard ring 13. In a diagnostic operating mode, the diagnostic circuit 15 may on the other hand tap off and analyze a measurement current or a measurement voltage at a measurement impedance between the guard ring 13 and ground in order to detect leakage currents. Due to the fact that the guard ring 13 is implemented as a ring structure separate from the guard ring 14 in the illustrated exemplary embodiment, in this diagnostic operating mode in which the diagnostic circuit taps off a measurement current or a measurement voltage at the measurement impedance, the function of the guard ring 14 is not impaired thereby since it too is able to be connected directly to ground, in particular the same ground potential that is also used for the guard ring 13, in the diagnostic operating mode.

Figure 4:
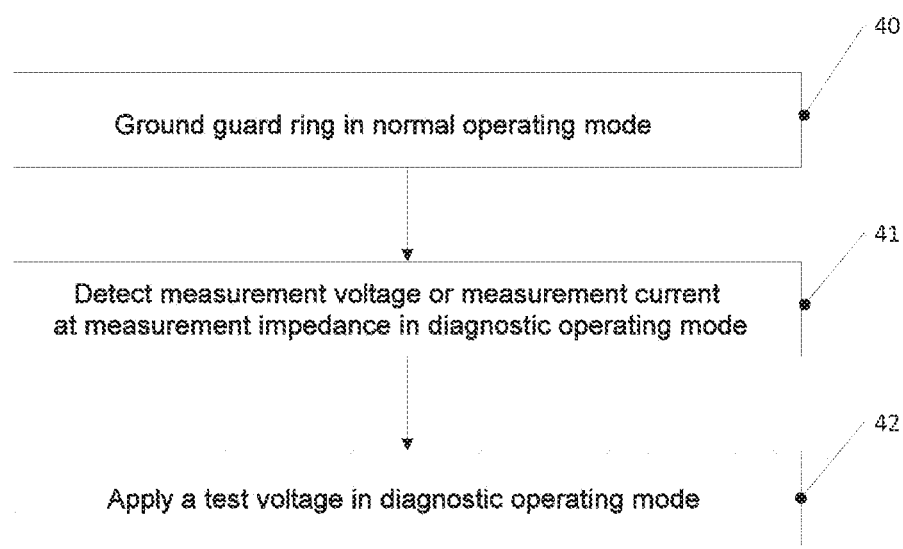
FIG. 4 is a flowchart for illustrating a method according to one exemplary embodiment.

A corresponding method is illustrated in FIG. 4. The order of the procedures in FIG. 4 should in this case not be interpreted as restrictive, and the various procedures may also each be performed multiple times or in another order. The method of FIG. 4 may be performed by way of the devices discussed above with reference to FIG. 1-3, in particular by way of the diagnostic circuit 15 of FIG. 1. For the sake of simplification and to avoid repetitions, reference is made to the above explanations with regard to FIG. 1-3 when explaining the method of FIG. 4. The method of FIG. 4 may however also be implemented independently of the circuits of FIG. 1-3.

At 40 in FIG. 4, a guard ring of a transformer arrangement is grounded in a normal operating mode. Examples of these include the guard ring 13 of FIG. 1 and the guard ring 26 of FIG. 2. In the normal operating mode, the transformer is then used to transmit signals, for example between different voltage domains, as explained above.

At 41 FIG. 4, a measurement voltage or a measurement current is detected at a measurement impedance between the guard ring and the ground potential in a diagnostic operating mode. At 42, a test voltage may in this case optionally be applied to the transformer. It is then possible to conclude as to the presence or absence of leakage currents on the basis of the measurement voltage or the measurement current. The diagnostic operating mode may be performed multiple times at different times. By way of example, the diagnostic operating mode may be performed in order to detect possible leakage currents during a product test, before for example the low-voltage integrated circuit 11 is dispatched to a customer. In addition or as an alternative, the diagnostic operating mode may also be performed any time when starting up a system that comprises the corresponding circuit containing the transformer. In the case of a motor vehicle as system, this may be performed for example together with other diagnostic functionalities of the motor vehicle before starting the engine. The diagnostic operating mode may also be performed at regular or irregular intervals during an expected service life of the circuit that contains the transformer. The diagnostic operating mode discussed here and the detection of leakage current is thus not restricted to specific times.

Details of such a diagnostic circuit and such methods are explained in even more detail below with reference to FIGS. 5 and 6.

Figure 5:
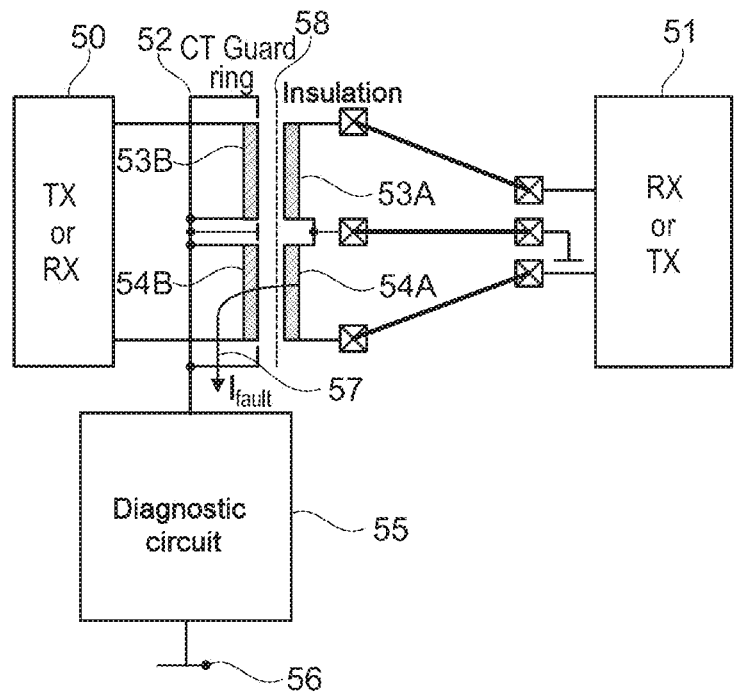
FIG. 5 is a diagram of a circuit according to one exemplary embodiment.

FIG. 5 shows a circuit diagram of a circuit according to one exemplary embodiment.

The circuit illustrated in FIG. 5 comprises a differential transformer having a first coil pair 53A, 53B and a second coil pair 54A, 54B. A first coil 53A of the first coil pair and a first coil 54A of the second coil pair are connected, as illustrated, to a communication circuit 51 for transmitting and/or receiving signals. The communication circuit 51 may be arranged for example in a high-voltage domain, for example in the high-voltage integrated circuit 10 of FIG. 1. A first terminal of the first coil 53A and a second terminal of the first col 54A receive signals to be transmitted from the communication circuit 51 and/or provide reception signals to the communication circuit 51, whereas a second terminal of the first coil 53A and a first terminal of the first coil 54A are grounded. A second coil 53B of the first coil pair and a second coil 54B of the second coil pair are accordingly connected to a communication circuit 50 for transmitting and/or receiving signals, wherein a first terminal of the second coil 53B and a second terminal of the second coil 54B again serve to transmit or receive signals and a second terminal of the second coil 53B and a first terminal of the second coil 54B are at a ground potential. The communication circuit 50 may be arranged for example in a low-voltage domain, for example in the low-voltage integrated circuit 11.

A guard ring, such as the guard ring 13 of FIG. 1 or the guard ring 26 of FIG. 2, bears the reference sign 52 in FIG. 5. An insulation barrier 58 in accordance with the insulation barrier 23 of FIG. 2 is formed by the coil pairs and the guard ring 52. The guard ring 52 is connected to a diagnostic circuit 55, and the diagnostic circuit 55 is connected to a ground potential 56. In a normal operating mode, the communication circuits 50 and 51 communicate with one another, and the diagnostic circuit 55 grounds 56 the guard ring 52. This communication may be implemented in any conventional manner.

In a diagnostic operating mode, the diagnostic circuit 55 taps off a measurement current or a measurement voltage at a measurement impedance that is connected between the guard ring 52 and the ground potential 56. In the diagnostic operating mode, a test voltage may be applied to the terminals of the first coils 53A, 54A, for example by the communication circuit 51 or by a specific test circuit. In the diagnostic operating mode, a maximum voltage occurring during operation may for example be applied across the insulation barrier as test voltage. By way of example, the low-voltage integrated circuit may be used to control power transistors in the high-voltage integrated circuit in order to drive a motor. In this case, in the diagnostic operating mode, these power switches may be driven (for example all of the high-side switches closed in the case of three-phase drive control) in such a way as to apply such a maximum voltage. This maximum voltage may be higher than a maximum voltage that occurs during correct operation in the normal operating mode. By way of example, in the normal operating mode, not all of the high-side switches are generally closed at the same time in the case of three-phase drive control. In other words, it is also possible to take into account voltages that may occur for example in the event of a fault in the drive control. It is thus also possible to apply a voltage higher than the maximum voltage during operation as test voltage in order to ensure a safety reserve.

In the event of a fault in the insulation barrier 58, a fault current Ifault flows, as indicated by an arrow 57, through the insulation barrier and across the guard ring and then through the measurement impedance of the diagnostic circuit 55 and is thus able to be detected.

The insulation barrier 58 is thereby able to be inspected for faults, for example as to whether the insulation barrier is intact.

Figure 6:
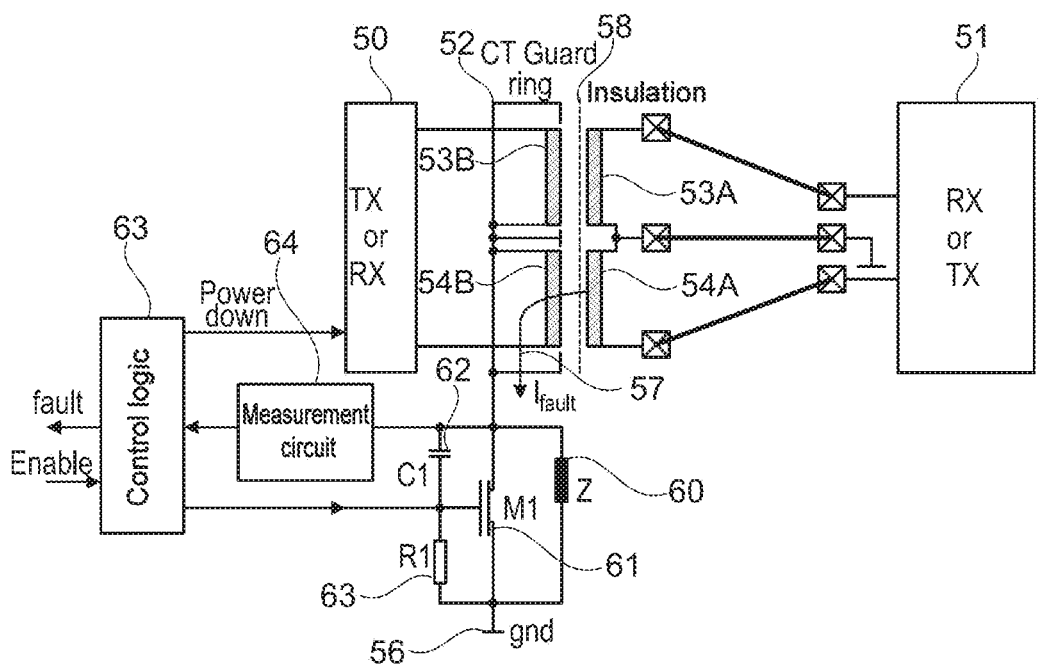
FIG. 6 is a diagram of a circuit to a further according exemplary embodiment.

One example of an implementation of the diagnostic circuit 55 is illustrated in FIG. 6. Those elements and components that have ready been explained with reference to FIG. 5 bear the same reference signs and are not discussed again.

In the example of FIG. 6, a diagnostic circuit comprises control logic 65 that switches between a normal operating mode and a diagnostic operating mode. The diagnostic circuit furthermore comprises a switching transistor 61 that is connected between the guard ring 52 and the ground potential 56.

In the normal operating mode, the control logic 65 drives the switching transistor 61 so as to be closed, such that it provides a low-resistance connection between the guard ring 52 and the ground potential 56, and the guard ring 52 is thus grounded.

In a diagnostic operating mode, the control logic 65 drives the transistor 61 so as to be open, such that it is essentially insulating between its terminals. In the diagnostic operating mode, the control logic 65 may additionally deactivate the communication circuit 50, for example switch it off.

A measurement impedance 60 is connected between the guard ring 52 and the ground potential 56, in parallel with the transistor 61. The measurement impedance 60 may for example comprise a measuring resistor. If the leakage current 57 flows, this then leads to a voltage drop across the measurement impedance 60, which is able to be measured by a measurement apparatus 64. The measurement apparatus 64 may for example comprise a comparator, an analog-to-digital converter or another voltage measurement apparatus for measurement purposes. In another exemplary embodiment, the measurement impedance 60 may comprise a capacitor. In this case, the leakage current 57, if present, charges the capacitor, and the measurement apparatus 64 may evaluate the temporal profile of the charging in order to detect the magnitude Ifault of the leakage current 57. In some implementations, using a capacitor as measurement impedance 60 offers better noise behavior than using a resistor. Combinations of resistors and capacitors are also possible for forming the measurement impedance 60.

If the voltage thus measured or the current thus measured exceeds a threshold value that indicates a leakage current, the control logic 65 outputs a fault signal Fault.

The diagnostic circuit may optionally also comprise a capacitor 62 that is connected between the guard ring 52 and a control terminal of the transistor 61, and a resistor 63 that is connected between the control terminal of the transistor 61 and the ground terminal 56. The diagnostic circuit is thereby additionally able to serve as an electrostatic discharge protection (ESD protection) circuit. A capacitance C1 of the capacitor 62 and a resistance R1 of the resistor 63 form an RC element whose time constant is selected such that it switches on the transistor 61 at typical rise times of ESD events. When an ESD event occurs, for example at the guard ring 52, the transistor 61 is thus also switched on in the diagnostic operating mode in order to dissipate the corresponding charge to ground. The transistor 61 thereby additionally serves to clamp ESD events during the diagnostic operating mode as well.

A few exemplary embodiments are defined through the following examples:

Example 1. A circuit, comprising:
a transformer having
a first coil that is arranged on a substrate,
a second coil that is arranged on the substrate above the first coil, and
a dielectric between the first coil and the second coil, and
a guard ring around the transformer, and
a diagnostic circuit that is configured so as to ground the guard ring in a normal operating mode and to tap off a measurement voltage or a measurement current at a measurement impedance between the guard ring and the ground potential in a diagnostic operating mode in order to detect a leakage current.

Example 2. The circuit according to example 1, wherein the diagnostic circuit comprises a switch between the guard ring and the ground potential and is configured so as to close the switch in the normal operating mode and to open it in the diagnostic operating mode.

Example 3. The circuit according to example 1 or 2, furthermore comprising a series circuit consisting of a resistor and a capacitor in parallel with the switch, wherein a node between the resistor and the capacitor is connected to a control input of the switch.

Example 4. The circuit according to one of examples 1 to 3, wherein the measurement impedance comprises a resistor and/or a capacitor.

Example 5. The circuit according to one of examples 1 to 4, furthermore comprising an evaluation circuit for detecting the leakage current based on the measurement voltage or the measurement current.

Example 6. The circuit according to one of examples 1 to 5, wherein the first coil comprises a first differential coil pair and the second coil comprises a second differential coil pair.

Example 7. The circuit according to one of examples 1 to 6, wherein the circuit is configured so as to transmit signals via the transformer in the normal operating mode.

Example 8. A method for detecting a leakage current in a circuit containing a transformer and a guard ring around the transformer, wherein the transformer comprises:
a first coil that is arranged on a substrate,
  a second coil that is arranged on the substrate above the first coil, and
  a dielectric between the first coil and the second coil, wherein the method comprises:
in a normal operating mode, grounding the guard ring, and
in a diagnostic operating mode, tapping off a measurement voltage or a measurement current at a measurement impedance between the guard ring and the ground potential in order to detect the leakage current.

Example 9. The method according to example 8, furthermore comprising:
closing a switch between the guard ring and the ground potential in the normal operating mode, and
opening the switch in the diagnostic operating mode.

Example 10. The method according to either of examples 8 and 9, wherein the measurement impedance comprises a resistor or a capacitor.

Example 11. The method according to one of examples 8 to 10, wherein the diagnostic operating mode is performed during a product test, when starting up a system comprising the transformer and/or repeatedly over a service life of the transformer.

Example 12. The method according to one of examples 8 to 11, furthermore comprising transmitting signals via the transformer in the normal operating mode.

Example 13. The method according to one of examples 1 to 8, furthermore comprising applying a test voltage via the transformer in the diagnostic operating mode.

Example 14. The method according to example 13, wherein the test voltage is greater than or equal to a maximum voltage occurring during operation of the circuit.

Example 15. The circuit according to one of examples 1 to 7, configured so as to perform the method according to one of examples 8 to 14.

Although specific exemplary embodiments have been illustrated and described in this description, those skilled in the art will recognize that a multiplicity of alternative and/or equivalent implementations may be selected as a substitute for the specific exemplary embodiments that are disclosed and described in this description, without departing from the scope of the disclosed invention. This application is intended to cover all adaptations or variations of the specific exemplary embodiments that are discussed here. It is therefore intended for this invention to be restricted only by the claims and the equivalents of the claims.

The invention claimed is:

1. A circuit, comprising:
a transformer that includes:
  a first coil that is arranged on a substrate,
  a second coil that is arranged on the substrate above the first coil, and
  a dielectric between the first coil and the second coil;
a guard ring around the transformer; and
a diagnostic circuit comprising a switch between the guard ring and a ground potential and comprising control logic configured to:
  switch between a normal operating mode and a diagnostic operating mode, the diagnostic circuit further configured to ground the guard ring to the ground potential in the normal operating mode and to tap off a measurement voltage or a measurement current at a measurement impedance element between the guard ring and the ground potential in the diagnostic operating mode;
  output, when the measurement voltage or the measurement current exceeds a threshold in the diagnostic operating mode, a fault signal indicating that a leakage current is present; and
a series circuit comprising a resistor and a capacitor in parallel with the switch, wherein a node between the resistor and the capacitor is connected to a control input of the switch.

2. The circuit of claim 1, wherein the diagnostic circuit is configured to close the switch in the normal operating mode and to open the switch in the diagnostic operating mode.

3. The circuit of claim 1, wherein the measurement impedance element comprises a resistor and/or a capacitor.

4. The circuit of claim 1, further comprising an evaluation circuit for detecting the leakage current based on the measurement voltage or the measurement current.

5. The circuit of claim 1, wherein the first coil comprises a first differential coil pair and the second coil comprises a second differential coil pair.

6. The circuit of claim 1, wherein the circuit is configured so as to transmit signals via the transformer in the normal operating mode.

7. The circuit of claim 1, wherein the diagnostic circuit and the transformer are formed on one integrated circuit.

8. A method for detecting a leakage current in a circuit that includes a transformer and a guard ring around the transformer, wherein the transformer comprises:
a first coil that is arranged on a substrate,
a second coil that is arranged on the substrate above the first coil, and
a dielectric between the first coil and the second coil,
wherein the method comprises:
  switching a diagnostic circuit between a normal operating mode and a diagnostic operating mode, wherein the diagnostic circuit comprises a switch between a guard ring around the transformer and a ground potential, wherein a series circuit comprises a resistor and a capacitor in parallel with the switch, and wherein a node between the resistor and the capacitor is connected to a control input of the switch, wherein the diagnostic circuit is configured to ground the guard ring to the ground potential in the normal operating mode, and to tap off a measurement voltage or a measurement current at a measurement impedance element between the guard ring and the ground potential in the diagnostic operating mode; and outputting, when the measurement voltage or the measurement current exceeds a threshold in the diagnostic operating mode, a fault signal indicating that the leakage current is present.

9. The method of claim 8, the method further comprising:

closing the switch in the normal operating mode; and opening the switch in the diagnostic operating mode.

10. The method of claim 8, wherein the measurement impedance element comprises a resistor or a capacitor.

11. The method of claim 8, wherein the diagnostic operating mode is performed during a product test, when starting up a system comprising the transformer and/or repeatedly over a service life of the transformer.

12. The method of claim 8, further comprising transmitting signals via the transformer in the normal operating mode.

13. The method of claim 8, the method further comprising applying a test voltage via the transformer in the diagnostic operating mode.

14. The method of claim 13, wherein the test voltage is greater than or equal to a maximum voltage on the transformer, occurring during the normal operating mode of the diagnostic circuit.

15. A diagnostic circuit comprising:

a switch between a guard ring around a transformer and a ground potential, wherein a series circuit comprises a resistor and a capacitor in parallel with the switch, and wherein a node between the resistor and the capacitor is connected to a control input of the switch; and control logic configured to:

switch between a normal operating mode and a diagnostic operating mode, wherein the diagnostic circuit is configured to ground the guard ring to the ground potential in the normal operating mode and to tap off a measurement voltage or a measurement current at a measurement impedance element between the guard ring and the ground potential in the diagnostic operating mode; and output, when the measurement voltage or the measurement current exceeds a threshold in the diagnostic operating mode, a fault signal indicating that the leakage current is present.

16. The diagnostic circuit of claim 15, wherein the diagnostic circuit is further configured to protect the guard ring from electrostatic discharge.

17. The diagnostic circuit of claim 15, wherein the control logic is further configured to deactivate signals sent to the transformer in the diagnostic operating mode.

* * * * *